(12) United States Patent
Fukuda

(10) Patent No.: US 8,929,480 B2
(45) Date of Patent: Jan. 6, 2015

(54) TRANSMITTER

(75) Inventor: Shuichi Fukuda, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 116 days.

(21) Appl. No.: 13/805,847

(22) PCT Filed: May 23, 2012

(86) PCT No.: PCT/JP2012/003373
§ 371 (c)(1),
(2), (4) Date: Dec. 20, 2012

(87) PCT Pub. No.: WO2012/164876
PCT Pub. Date: Dec. 6, 2012

(65) Prior Publication Data
US 2013/0093495 A1   Apr. 18, 2013

(30) Foreign Application Priority Data

Jun. 3, 2011   (JP) .................................. 2011-125815

(51) Int. Cl.
| | | |
|---|---|---|
| H04L 27/04 | (2006.01) | |
| G06G 7/14 | (2006.01) | |
| H03C 1/36 | (2006.01) | |
| H04B 1/04 | (2006.01) | |
| H04L 27/36 | (2006.01) | |

(52) U.S. Cl.
CPC .. *G06G 7/14* (2013.01); *H03C 1/36* (2013.01); *H04B 1/0483* (2013.01); *H04B 1/0475* (2013.01); *H03C 2200/0025* (2013.01); *H03C 2200/0058* (2013.01); *H04L 27/36* (2013.01)
USPC ........... 375/295; 375/259; 375/146; 375/302; 341/143; 341/144

(58) Field of Classification Search
USPC .................. 375/259, 146, 295, 302; 327/361
See application file for complete search history.

(56) References Cited

U.S. PATENT DOCUMENTS

| | | | |
|---|---|---|---|
| 6,097,259 A | 8/2000 | Saito et al. | |
| 6,980,889 B2 | 12/2005 | Ito | |

(Continued)

FOREIGN PATENT DOCUMENTS

| | | |
|---|---|---|
| JP | 10-304001 | 11/1998 |
| JP | 2010-245962 | 10/2010 |

OTHER PUBLICATIONS

Written Opinion of the International Searching Authority dated Jul. 10, 2012, for International application No. PCT/JP2012/003373.

(Continued)

*Primary Examiner* — Eva Puente
(74) *Attorney, Agent, or Firm* — Morgan, Lewis & Bockius LLP

(57) ABSTRACT

There is provided a transmitter with a small area and low noise. A direct RF modulation transmitter is constituted by an N-number of input signal delay-attached direct RF converters to which an I digital baseband signal is input, an M-number of input signal delay circuit-attached direct RF converters (DDRCs) to which a Q digital baseband signal is input, a Divide-by-2 divider for generating a differential local signal differing in phase by 90 degrees, an output matching circuit, and a delay control circuit for controlling an input data delay amount for the DDRCs. This transmitter sets delay amounts for the DDRCs using the delay control circuit independently. Particularly when N is set to equal M and the same amount of delay is set for N-number of converters corresponding to the I digital baseband signal and the Q digital baseband signal, noise reduction effect in a predetermined frequency band is heightened.

7 Claims, 8 Drawing Sheets

(56) References Cited

U.S. PATENT DOCUMENTS

| | | | |
|---|---|---|---|
| 7,421,037 B2* | 9/2008 | Shakeshaft et al. | 375/295 |
| 8,385,469 B2* | 2/2013 | Wang et al. | 375/302 |
| 8,542,773 B2* | 9/2013 | Yu et al. | 375/302 |
| 2004/0204100 A1 | 10/2004 | Braithwaite | |
| 2009/0180466 A1* | 7/2009 | Soul et al. | 370/350 |
| 2009/0315632 A1* | 12/2009 | Ito | 332/117 |
| 2011/0150125 A1 | 6/2011 | Yu et al. | |
| 2011/0216810 A1* | 9/2011 | Kumar | 375/146 |
| 2013/0003881 A1* | 1/2013 | Ingels | 375/259 |

OTHER PUBLICATIONS

Extended European Search Report dated Jan. 22, 2014 for corresponding European Patent Application No. 12793290.3.

International Search Report for International application No. PCT/JP2012/003373.

* cited by examiner

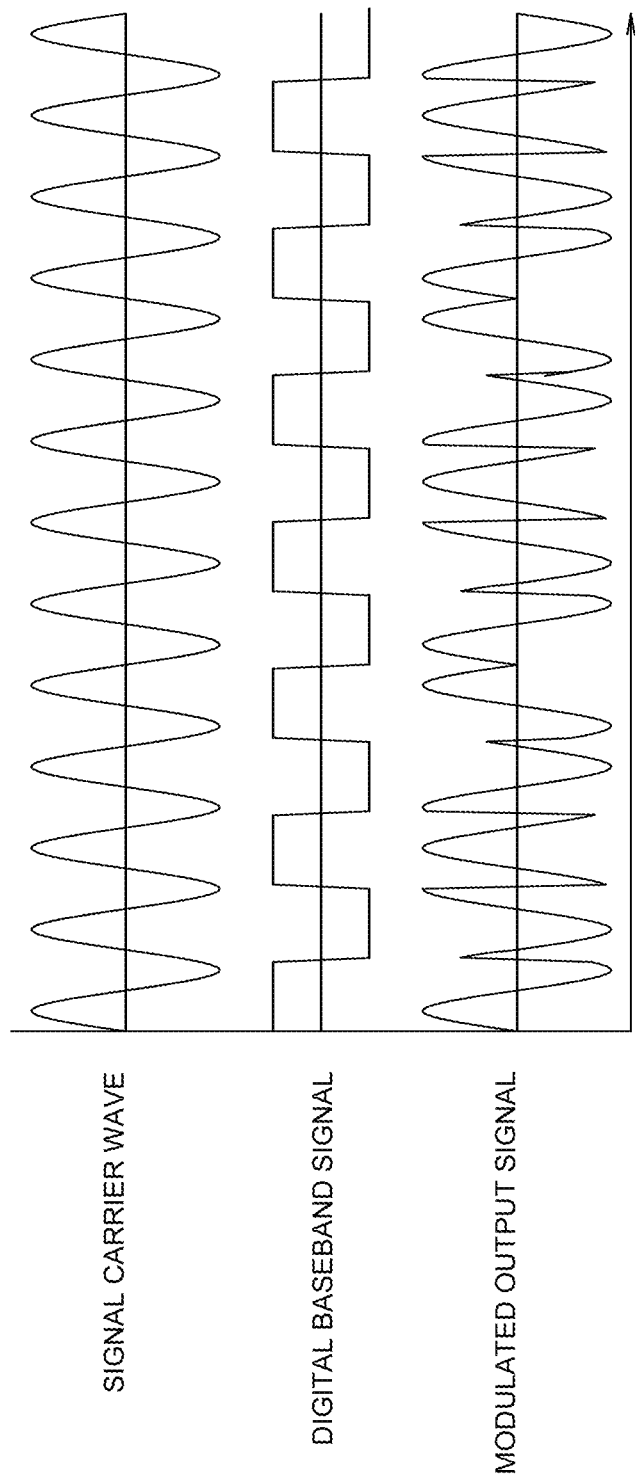

US 8,929,480 B2

TRANSMITTER

TECHNICAL FIELD

The present invention relates to a transmitter, more particularly to a transmitter including a digital-to-analog converter.

BACKGROUND ART

Currently, there is a portable communication terminal (referred to as a mobile terminal in this specification hereafter) capable of corresponding to multiple wireless communication standards and multiple frequency bands. Corresponding to multiple standards is referred to as multimode correspondence, and corresponding to multiple frequency bands is referred to as multiband correspondence.

In recent years, a transmitter that also conducts frequency conversion to an RF transmission carrier frequency when converting a digital baseband signal to an analog signal (digital-to-analog conversion), and directly modulating a digital signal to an RF frequency is well known as a configuration of such a multimode/multiband corresponding terminal for transmission. Such a transmitter is disclosed in Patent Document 1, for example.

The invention disclosed in Patent Document 1 has an RF frequency converter that is similar to a Gilbert cell mixer incorporated to a part of series-connected transistors circuit for a well-known current control-type digital-to-analog converter. According to such a configuration, it is possible to have a digital-to-analog converter, an RF frequency converter or an RF modulator as independent circuits, and conduct digital-to-analog conversion and RF frequency modulation simultaneously and multi-functionally.

The transmitter disclosed in Patent Document 1 can be called a digital-to-RF converter, a direct RF converter, or a direct RF modulation transmitter constituted thereby. It has several merits such as being able to omit an analog baseband filter circuit between the digital-to-analog converter and the RF frequency converter, which is normally required for the conventional transmitter that carries out separate operations.

FIG. 6 illustrates the configuration of the direct RF modulation transmitter described above. The direct RF modulation transmitter illustrated in FIG. 6 is constituted by two digital-to-RF converters (DRC) 1 and 2, a Divide-by-2 divider 3, and an output matching circuit 4.

An RF signal $L_{oin+}$ for multiplying frequencies (referred to as transmission local RF signal hereafter) and a transmission local RF signal $L_{oin-}$, which results from inverting the phase of the RF signal $L_{oin-}$, are externally supplied to the Divide-by-2 divider 3. The Divide-by-2 divider 3 receives the transmission local RF signals $L_{oin+}$ and $L_{oin-}$, generates two pairs of differential local signals $T_{xLoI+}$ and $T_{xLoI-}$, and $T_{xLoQ+}$ and $T_{xLoQ-}$ each differing in phase by 90 degrees, and outputs them to the DRCs 1 and 2. In this example, since differential local signals of 0 degrees and 90 degrees are generated by the Divide-by-2 divider 3, frequency of the transmission local RF signals $L_{oin+}$ and $L_{oin-}$ is double the target frequency of a transmission carrier wave. The frequency of the differential local signals $T_{xLoI+}$, $T_{xLoI-}$, $T_{xLoQ+}$, and $T_{xLoQ-}$ is that of the transmission carrier wave. There is a 90 degree phase difference between the differential local signals $T_{xLoI+}$ and $T_{xLoI-}$, and $T_{xLoQ+}$ and $T_{xLoQ-}$.

The DRC 1 and the DRC 2 have the same configuration. The differential local signals $T_{xLoI+}$ and $T_{xLoI-}$, and $T_{xLoQ+}$ and $T_{xLoQ-}$ are supplied to the DRC 1 and the DRC 2 with the same type of phase difference as that of a so-called IQ direct modulator, thereby constituting the direct RF modulation transmitter. That is, an I (In-phase) digital baseband signal (referred to as 'IBB Data' in the drawing) is input to the DRC 1. Moreover, a Q (Quadrature) digital baseband signal (referred to as 'QBB Data' in the drawing) is input to the DRC 2.

Furthermore, a sampling clock signal $CLK_{BB}$ is input to the DRCs 1 and 2. The DRCs 1 and 2 are signal converters, each having an integrated function of a digital-to-analog converting function and a frequency multiplying function for converting the frequency of a baseband signal to the RF signal. Through such functions, the DRC 1 outputs an output differential signal based on the clock signal $CLK_{BB}$, the I digital baseband signal, and the differential local signal. Moreover, the DRC 2 outputs an output differential signal based on the clock signal $CLK_{BB}$, the Q digital baseband signal, and the differential local signal. The output differential signals from the DRCs 1 and 2 are added together, and the resulting signal is output as a carrier wave via the output matching circuit 4 and a power amplifier (referred to as PA in the drawing) in the subsequent stage.

The output matching circuit 4 is a circuit that is constituted by passive elements, such as a capacity and/or an inductor element, and has a bandpass-type gain characteristic, which has the frequency of the transmission carrier wave as a central frequency. Note that the direct RF modulation transmitter illustrated in FIG. 6 carries out addition of the output differential signal output from the DRC 1 and the output differential signal output from the DRC 2 through direct connection of signal paths on the premise that the DRCs 1 and 2 output currents.

FIG. 7 illustrates a circuit having the configuration of each of the DRC 1 and the DRC 2 disclosed in the aforementioned Patent Document 1. Each of the DRC 1 and the DRC 2 includes a block for processing signals on the least significant bit (LSB) side, and a block for processing signals on the most significant bit (MSB) side. The block on the LSB side is constituted by current sources 200, 201, ... 20k, in each of which unit cells are weighted in a binary manner, local signal switches 220, 221, ... 22k arranged in a Gilbert cell form, and data signal switches 240, 241, ... 24k.

The block on the MSB side has a structure in which current sources 210, each weighted by the same value, and local signal switches 230 and data signal switches 250 arranged in a Gilbert cell form are respectively connected in parallel where the number of respective components is equal to the number of required bits. According to such a structure, the direct RF modulation transmitter disclosed in Patent Document 1 can conduct digital-to-analog conversion and frequency multiplication simultaneously. Note that in the example illustrated in FIG. 7, current outputs from all cells are converted to respective voltages by external loads deployed outside of the DRCs.

FIG. 8 is a diagram for describing a typical operation of a circuit called digital-to-RF converter or direct RF converter. Such a circuit receives an RF signal and a digital baseband signal and modulates the RF signal in accordance to the digital baseband signal and then outputs the resulting modulated signal. Regarding the modulated signal, a phase inverted signal of the transmission carrier wave is output at the time when the digital baseband signal is changed over.

Noise of an output signal from the direct RF modulation transmitter will now be described. With the direct RF modulation transmitter, the main factors for determining a noise floor near the carrier wave of the output signal are Thermal noise and Flicker noise, which generates from an inner element, and quantization noise, which generates in the digital-to-analog conversion process. A transmitter for conducting digital-to-analog conversion and frequency multiplication with separate circuit blocks allows installation of an analog filter immediately after digital-to-analog conversion. Therefore, hardly any quantization noise is included in the signal after frequency multiplication.

Whereas the conventional DRC illustrated in FIG. 7 has an integrated function of a digital-to-analog converting function and a frequency multiplying function, as mentioned above. Therefore, the quantization noise generated during digital-to-analog conversion is output as noise near the carrier wave. As a result, with the conventional DRC illustrated in FIG. 7, generation of quantization noise during digital-to-analog conversion needs to be controlled to a minimum.

The following Equation 1 represents quantization noise amount generating during digital-to-analog conversion when a typical digital-to-analog converter has output a desired full scale wave signal. Equation 1 represents noise amount when a desired wave signal level is made as a reference, wherein B denotes bit number, and fs denotes sampling frequency.

$$\text{NoiseFloor(dBc/Hz)} = -\{6/02 \cdot B + 1.76 + 10 \cdot \log(fs/2)\} \quad \text{Equation 1}$$

Equation 2 represents quantization noise amount in the case where a digital-to-analog converted signal undergoes frequency multiplication so as to be converted to a higher-frequency wave when the DRC illustrated in FIG. 7 has output a desired full scale wave signal. According to Equation 1 and Equation 2, it is understood that increasing either the bit number B or the sampling frequency fs is necessary for reducing the noise. When considering implementation of low quantization noise in a complementary metal oxide semiconductor (CMOS) circuit, the maximum implementable frequency should be set as the sampling frequency, and insufficient reduction of noise should be compensated by increase in bit number.

$$\text{NoiseFloor(dBc/Hz)} = -\{6.02 \cdot B + 1.76 + 10 \cdot \log(fs/2) + 10 \cdot \log(2)\} \quad \text{Equation 2}$$

If the DRCs 1 and 2 illustrated in FIG. 7 are made up of MOS transistors, current sources 200 to 20k and 210 occupy most of the area of the DRCs 1 and 2. The area of the current sources 200 to 20k and 210 is determined with accuracy of fluctuation in current, which is calculated from bit number of an input digital signal and required linearity (distortion characteristic). The bit number of the input digital signal and the required linearity depend on the target quantization noise level of the direct RF modulation transmitter.

Relative fluctuation of the current output from the MOS transistors is given in Equation 3. σI/I in Equation 3 denotes standard deviation of the relative fluctuation of current. $A_\beta$ and $A_{VT}$ denote parameters for fluctuation dependant on the semiconductor process, $V_{GS}$ denotes a voltage between a gate and a source of the MOS transistor, $V_t$ denotes a threshold voltage of the MOS transistor, W denotes channel width of the MOS transistor, and L denotes channel length of the MOS transistor.

$$\left(\frac{\sigma_I}{I}\right) = \sqrt{\frac{\frac{1}{2}\left[A_\beta^2 + \frac{4A_{VT}^2}{(V_{GS}-V_T)^2}\right]}{(WL)_{min}}} \quad \text{Equation 3}$$

In the case where the bit number of the digital signal to be converted has increased, maintaining quality of the linearity equal before and after increase is considered. If making a required value for relative fluctuation of current be $\frac{1}{2}^{1/2}$ is taken into consideration, according to the aforementioned Equation 3, it is necessary to double the area occupied by the current sources by increasing one bit of the digital signal. Moreover, as the required element number for the configuration of the DRCs 1 and 2 is doubled by increasing one bit, the current source area quadruples overall. As a result, the method for increasing bit number to reduce the quantization noise has a drawback of an increase in area of the DRCs 1 and 2.

Furthermore, the RF transmitter for a wireless communication device is not required to output a uniform amount of noise included in an output RF signal across the entire frequency band, but frequency bands with strict noise requirements and frequency bands without strict requirements are mixed therein. For example, an RF transmitter based on W-CDMA, which is a cellular phone standard, is applied to a frequency division duplex (FDD) system in which reception and transmission are conducted simultaneously, wherein noise requirement near a reception frequency is most strict.

PRIOR ART DOCUMENTS

Patent Documents

Patent Document 1: Patent Application Publication US 2005/0111573 A1

SUMMARY OF THE INVENTION

Problem to be Solved

However, in the case where the conventional RF modulation transmitter is constituted by CMOS semiconductors, it is necessary to increase bit number for digital-to-analog conversion in order to decrease the quantization noise, and it is necessary to control the relative fluctuation of current between elements that constitute the current sources in order to increase the bit number. In order to control the relative fluctuation of current, it is impossible to use microscopic elements in which fluctuation in characteristics easily occurs for the direct RF modulation transmitter. Therefore, the circuit area of the direct RF modulation transmitter increases as bit number increases. Increase in the circuit area is a major problem as it leads to increase in manufacturing cost.

The present invention is devised through consideration of the aforementioned problem. An objective thereof is to provide a transmitter with low noise and capable of avoiding increase in circuit area.

Solution to the Problem

In order to resolve the above problem, a transmitter according to an aspect of the present invention is characterized by including: a plurality of direct RF converters (e.g., DRCs 302a to 302n and 306a to 306m illustrated in FIG. 1) connected in parallel; a plurality of delay circuits (e.g., delay circuits 304a to 304n and 307a to 307m illustrated in FIG. 1) for delaying a digital baseband input signal (e.g., IBB Data and QBB Data illustrated in FIG. 1) to be input to the plurality of direct RF converters; and an adder (e.g., output matching circuit 305 illustrated in FIG. 1) for adding respective output signals output from the plurality of direct RF converters. Each of the direct RF converters receives the digital baseband input signal and an RF signal, modulates the RF signal with the digital baseband input signal, and outputs the resulting modulated signal as the output signal.

Furthermore, in a transmitter according to an aspect of the present invention, the plurality of delay circuits described above may be connected the plurality of direct RF converters, by one-to-one.

Yet further, in a transmitter according to an aspect of the present invention, the plurality of direct RF converters according to the invention described above may include a first block including an N-number of the direct RF converters and a second block including an M-number of the direct RF converters, each of the direct RF converters included in the first block may receive an in-phase digital baseband input signal and a first RF signal, modulate the first RF signal with the in-phase digital baseband input signal, and output the resulting modulated signal as a first output signal. Each of the direct RF converters included in the second block may receive an quadrature digital baseband input signal and a second RF signal having a 90-degree different phase than the first RF signal, modulate the second RF signal with the quadrature digital baseband input signal, and output the resulting modulated signal as a second output signal, and the adder may add the first output signals from the N-number (N is a natural number) of the respective direct RF converters included in the first block and the second output signals from the M-number (M is a natural number) of the respective direct RF converters included in the second block.

Yet even further, a transmitter according to an aspect of the present invention as described above is characterized by further including a delay control circuit (e.g., delay control circuit 309 illustrated in FIG. 1) for setting a delay amount for the digital baseband input signal for each of the plurality of delay circuits.

Yet even further, in a transmitter according to an aspect of the present invention, the delay control circuit according to the invention described above may set a delay amount for each of the delay circuits connected to the N-number of direct RF converters included in the first block to delay the in-phase digital baseband input signal, and set a delay amount for each of the delay circuits connected to the M-number of direct RF converters included in the second block to delay the quadrature digital baseband input signal.

Yet even further, in a transmitter according to the present invention, each of the first block and the second block according to the present invention described above may include the N-number of direct RF converters (M=N), and the delay control circuit may set the same delay amount to the i-th (i is a number equal to or greater than 1 and equal to or less than N) direct RF converter of the direct RF converters included in the first block, and the i-th direct RF converter of the direct RF converters included in the second block.

Yet even further, in a transmitter according to the present invention, the delay circuit according to the present invention described above may generate a delayed digital signal resulting from delaying the period of the digital baseband input signal data rate by an integral multiple in accordance with a delayed amount. Yet even further, in a transmitter according to the present invention, the delay circuits described above may include an equal number of flip-flop circuits (e.g., flip-flop circuits 501a to 501k illustrated in FIG. 3) to the integral multiple.

Advantageous Effects of the Invention

The transmitters according to the above aspects are capable of setting a Notch frequency described later to an arbitrary frequency by using a plurality of direct RF converters in parallel, each having an input signal delaying function, and are thereby capable of appropriately filtering quantization noise in required frequency bands.

As a result, in the case of implementing such a transmitter with a semiconductor integrated circuit, requirement for increase in the bit number for quantization noise can be relaxed, and the bit number for digital-to-analog conversion can be further decreased than with the conventional transmitter. This allows provision of a smaller area.

Accordingly, the present invention allows provision of a direct RF modulation transmitter with low noise and capable of avoiding increase in circuit area.

BRIEF DESCRIPTION OF THE DRAWINGS

FIG. 8 is a diagram for describing a typical operation of a digital-to-RF converter, etc.

DESCRIPTION OF EMBODIMENTS

A transmitter according to an embodiment of the present invention will be now described.

Circuit Configuration

Figure 1:
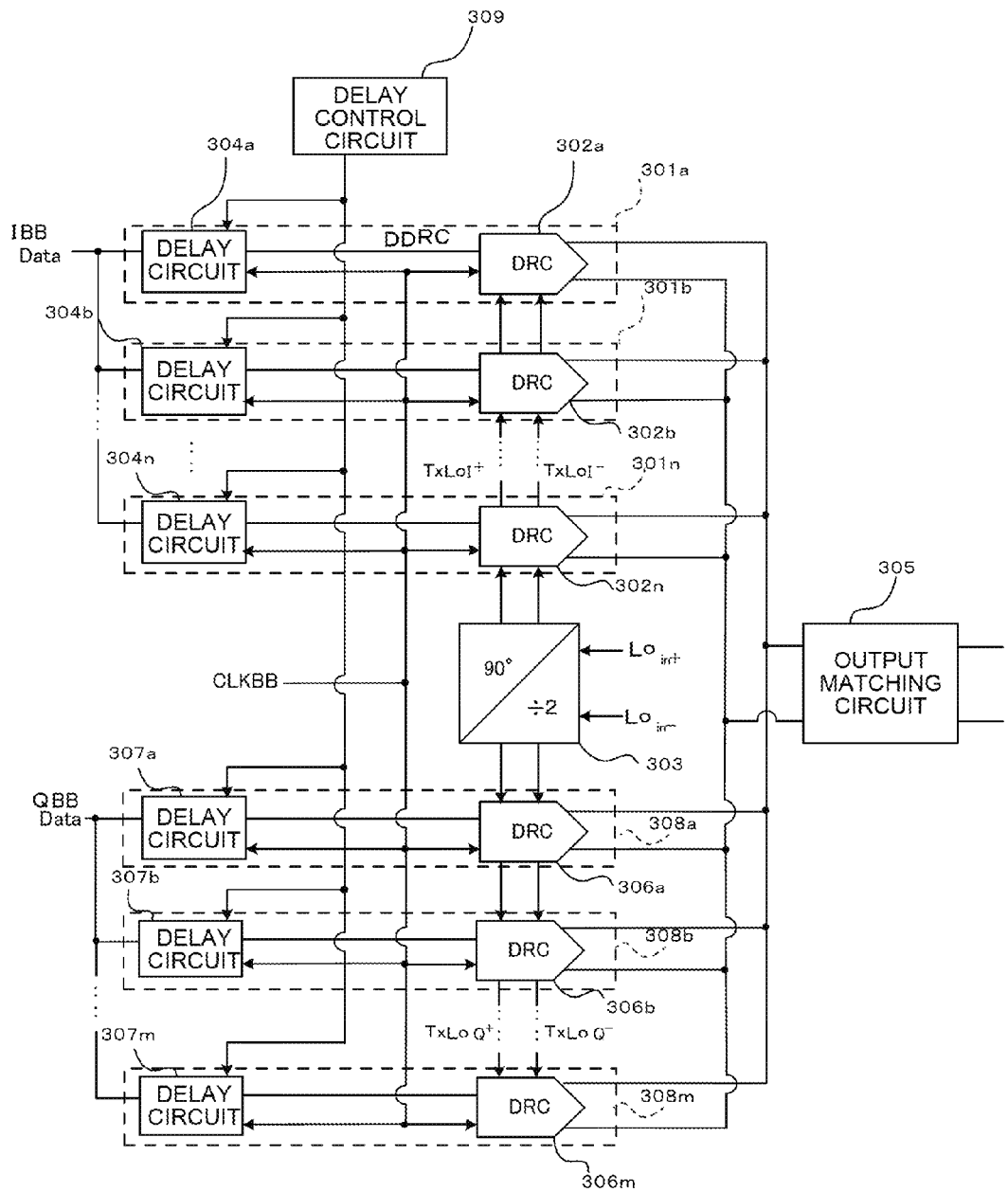
FIG. 1 is a circuit diagram of a direct RF modulation transmitter according to an embodiment of the present invention.

FIG. 1 is a circuit diagram of a direct RF modulation transmitter according to this embodiment. The direct RF modulation transmitter according to this embodiment is an IQ quadrature amplitude modulation method type (CARTESIAN type) direct RF modulation transmitter. The direct RF modulation transmitter according to this embodiment includes an N-number of direct RF converters (referred to as DRCs hereafter) 302a to 302n to which an I digital baseband signal is input, and an M-number of DRCs 306a to 306m to which a Q digital baseband signal is input.

In this embodiment, the DRCs 302a to 302n constitute a first block of DRCs, and the DRCs 306a to 306m constitute a second block of DRCs.

The DRCs 302a to 302n are connected to corresponding delay circuits 304a to 304n (delay circuits having the same a, b, . . . n attached after the number) and constitute direct RF converters each having an input signal delaying function (referred to as DDRC (Delay-attached Direct RF Converter) hereafter) 301a to 301n. The DRCs 306a to 306m are connected to corresponding delay circuits 307a to 307m (delay circuits having the same a, b . . . n attached after the number) and constitute DDRCs 308a to 308m.

Furthermore, the direct RF modulation transmitter according to this embodiment is constituted by a Divide-by-2 divider 303, which receives transmission local RF signals $L_{oin+}$ and $L_{oin-}$, and generates a pair of differential local signals $T_{xLoI-}$ and $T_{xLoI-}$ and another pair of differential local signals $T_{xLoQ-}$ and $T_{xLoQ-}$ differing in phase by 90 degrees, an output matching circuit 305, and a delay control circuit 309, which controls delay amount of input data to be input to the N-number of DDRCs 301 and the M-number of DDRCs 308.

The output matching circuit 305 is a circuit having a band-pass-type gain characteristic, which has the frequency of the transmission carrier wave as a central frequency, and is constituted by passive elements, such as a capacity and/or an inductor element. Note that the direct RF modulation transmitter illustrated in FIG. 1 carries out addition of output differential signals output from the DRCs 302a to 302n and the output differential signals output from the DRCs 306a to 306m by connecting signal paths on the premise that the DRCs 302a to 302n and the DRCs 306a to 306m output currents. Alternatively, it may be added by the output matching circuit 305.

The delay control circuit 309 can set independently each of delay amounts for input data of the DDRCs 301a to 301n and the DDRCs 308a to 308m. The delay amounts for the input data of the DDRCs 301a to 301n are D1, D2 . . . DN, and delay amounts for the input data of the DDRCs 308a to 308m are D1, D2 . . . DM.

Figure 2:
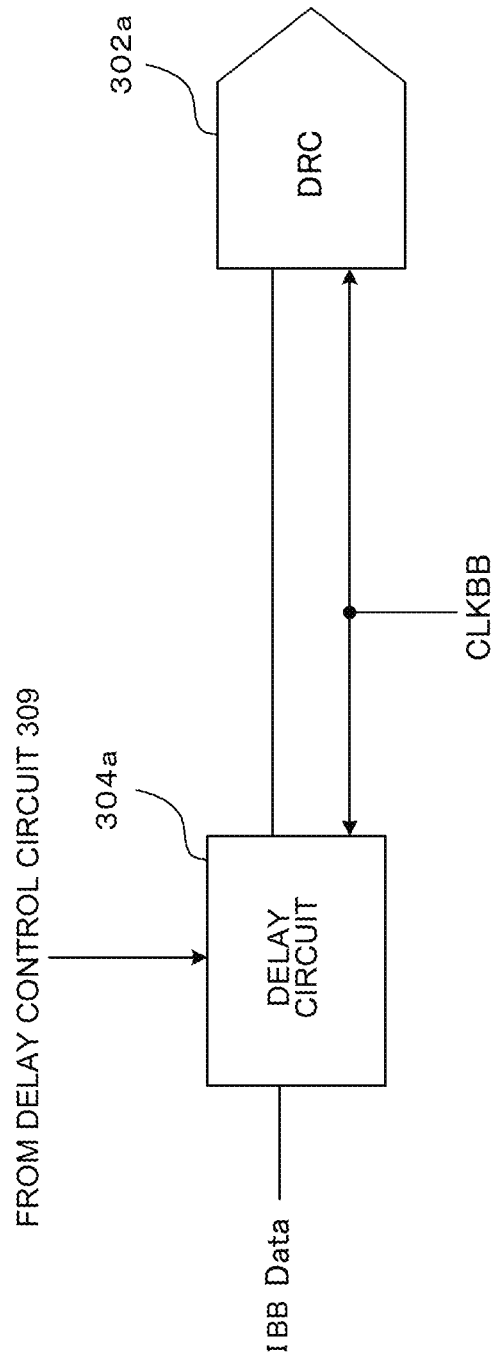
FIG. 2 is a diagram for explaining input data to be input to a DDRC illustrated in FIG. 1.

FIG. 2 is a diagram for explaining input data to be input to a DDRC (DDRC 301a in FIG. 2) illustrated in FIG. 1. An I digital baseband signal (referred to as 'IBB Data' in FIG. 2) and a sampling clock signal $CLK_{BB}$ are input to the DRC 301a. Once the I digital baseband signal is delayed due to a delay control signal output from the delay control circuit 309 illustrated in FIG. 1, it is input to the DRC 302a.

Note that as with the configuration illustrated in FIG. 2, an I digital baseband signal, a sampling clock signal $CLK_{BB}$, and a delay control signal are input to the DDRCs 301b to 301n illustrated in FIG. 1, and the delayed I digital baseband signal is input to each corresponding DRC. Meanwhile, a Q digital baseband signal, a sampling clock signal $CLK_{BB}$, and a delay control signal are input to the DDRCs 308a to 308m illustrated in FIG. 1, and the delayed Q digital baseband signal is input to each corresponding DRC.

Figure 3:
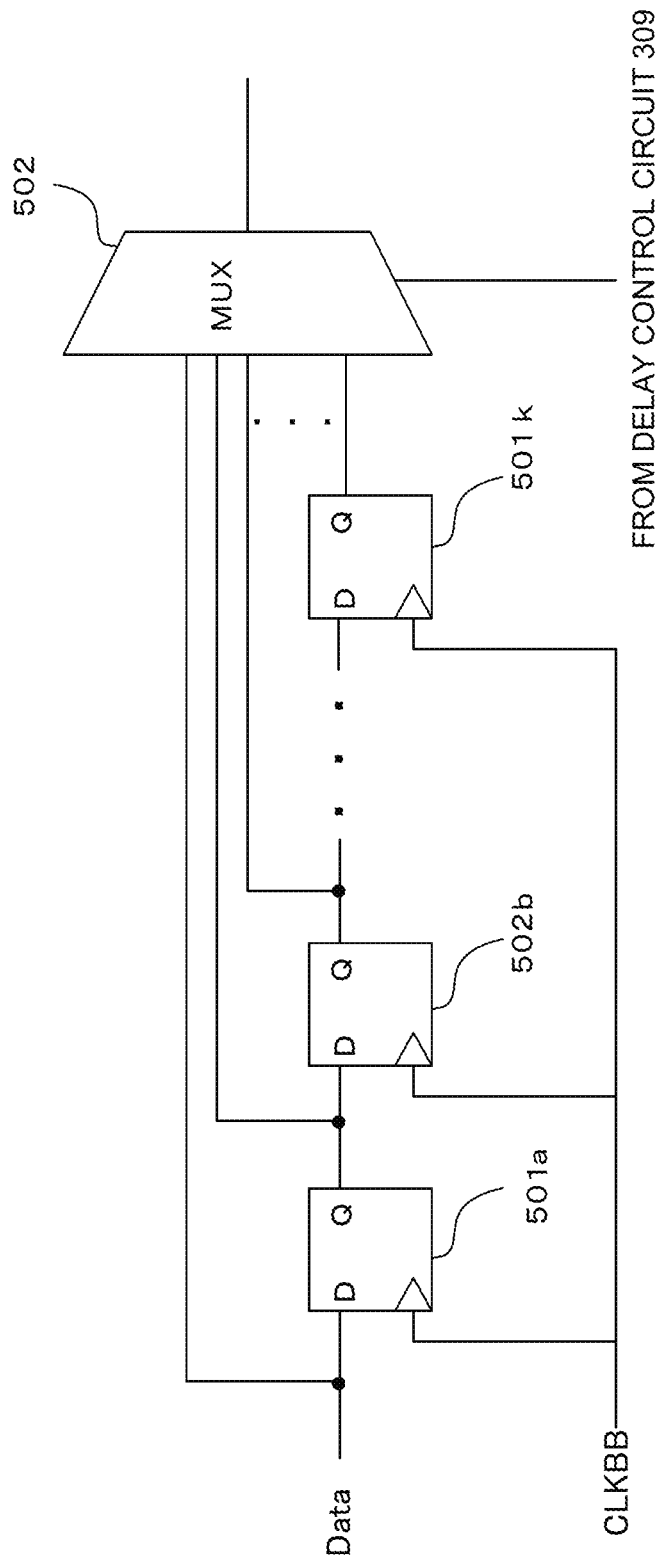
FIG. 3 is a diagram for explaining a configuration of a delay circuit illustrated in FIG. 2.

FIG. 3 is a diagram for explaining the configuration of the delay circuit 304a illustrated in FIG. 2. Note that the delay circuits 304a to 304n and the delay circuits 307a to 307m are all have the same configuration. The delay circuit 304a is constituted by k-number of flip-flop circuits 501a to 501k, and a multiplexer 502, which has (k+1)-number of input terminals and is controlled for selection in conformity with the delay control signal output from the delay control circuit 309. When one clock pulse of a sampling clock $CLK_{BB}$ is $T_{clkbb}$, the delay circuit 304a may set a delay amount to delay at intervals of time $T_{clkbb}$ of k×$T_{clkbb}$ from zero, namely delay the I digital baseband signal by an integral (0 to k) multiple of an arbitrary sampling clock $CLK_{BB}$.

The respective delay amounts of the input data of the DDRCs 301a to 301n illustrated in FIG. 1 are set in the following manner, for example, in conformity with the delay control signal output from the delay control circuit 309. Note that 'a' in the following equations denotes an arbitrary natural number.

$$D1=0$$

$$D2=T_{clkbb} \times a$$

$$D3=2 \times T_{clkbb} \times a \ldots$$

$$DN=(N-1) \times T_{clkbb} \times a$$

Moreover, the respective delay amounts of the input data of the DDRCs 308a to 308m illustrated in FIG. 1 are set in the following manner, for example, in conformity with the delay control signal output from the delay control circuit 309. Note that 'a' in the following equations denotes an arbitrary natural number.

$$D1=0$$

$$D2=T_{clkbb} \times a$$

$$D3=2 \times T_{clkbb} \times a \ldots$$

$$DM=(M-1) \times T_{clkbb} \times a$$

Quantization Noise

Next, quantization noise generated by the direct RF modulation transmitter illustrated in FIG. 1 will be described. Quantization noise generated through digital-to-analog conversion by the DDRCs 301a to 301n illustrated in FIG. 1 is affected at the output point of the direct RF modulation transmitter by a filtering effect represented by the following Equation 4 on the higher frequency wave side than the transmission carrier frequency beginning at the transmission carrier frequency. Moreover, on the lower frequency side than the transmission carrier frequency, it is affected by a filtering effect based on a transfer characteristic established by turning back the higher frequency wave side transfer characteristic at the transmission carrier frequency toward the low frequency side.

Equation 4 represents the filtering effect using a Z function with a sampling clock frequency fs as a reference. 'a' in Equation 4 denotes a natural number resulting from normalizing delay amount in units of the sampling clock pulse ($T_{clkbb}$), n denotes an integer such that n=N−1 holds true for N-number of the DDRCs 301a to 301n illustrated in FIG. 1, and delay of the N-th DDRC is 0, $T_{clkbb} \times a$, $2 \times T_{clkbb} \times a$, . . . $n \times T_{clkbb} \times a$ for the first to the N-th DDRC, respectively. Note that $f_{off}$ denotes a detuning frequency from the transmission carrier frequency.

$$(1+Z^{-a}+Z^{-2a}+\ldots+Z^{-na}) \cdot \frac{\sin\left(\frac{\pi \cdot f_{off}}{f_s}\right)}{\left(\frac{\pi \cdot f_{off}}{f_s}\right)} \quad \text{Equation 4}$$

The above Equation 4 may also be applied to the DDRCs 308a to 308m by making n=M−1.

Figure 4:
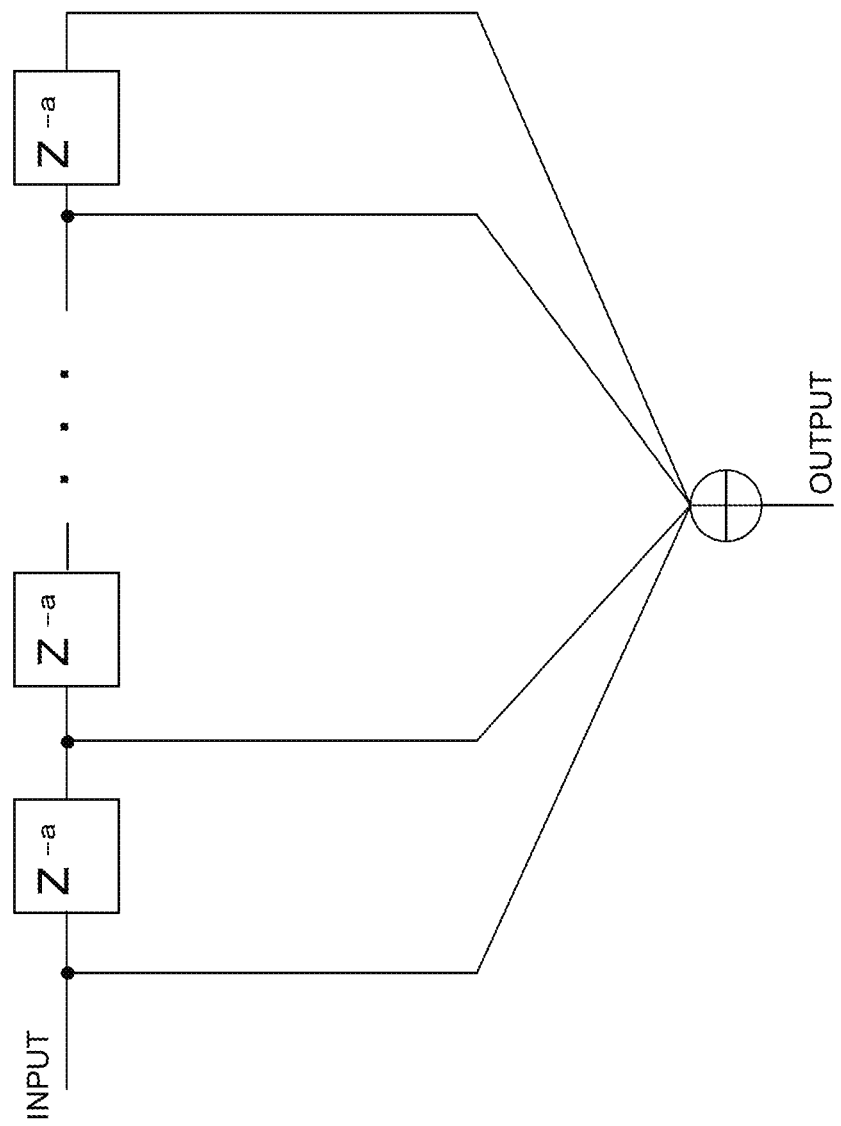
FIG. 4 illustrates equivalent functional characteristics according to the embodiment of the present invention.

The fact that Equation 4 represents the filtering effect can be easily and clearly explained by taking the case where the differential local signals $T_{xLoI+}$, $T_{xLoI-}$, $T_{xLoQ+}$ and $T_{xLoQ-}$ with the direct RF modulation transmitter illustrated in FIG. 1 are zero as a conceptual model. In this case, the DRCs 302a to 302n and 306a to 306m are simple digital-to-analog converters that do not conduct frequency conversion. Digital-to-analog conversion is an equivalent conversion with a gain 1, and focusing on the I digital baseband signal as illustrated in FIG. 4, equivalent functional characteristics represented by a transfer function for Z transform may be considered. This is a well-known finite impulse response (FIR) filter, which clarifies that quantization noise even in the direct RF modulation transmitter is suppressed as represented in Equation 4.

Figure 5:
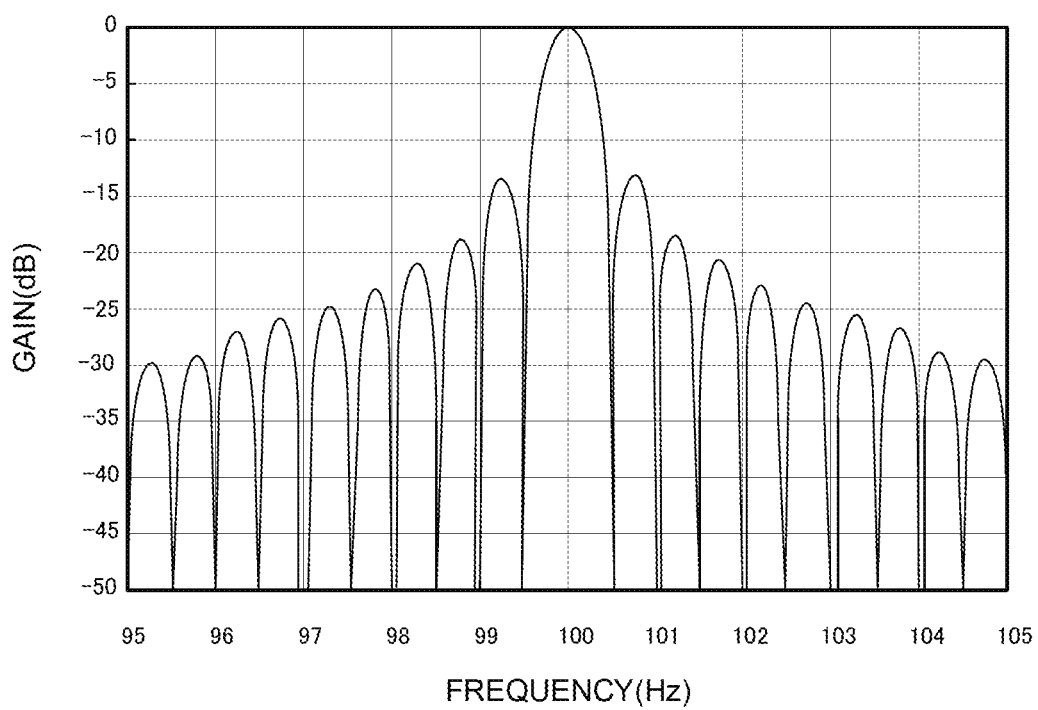
FIG. 5 is a graph illustrating gain characteristics of quantization noise according to the embodiment of the present invention.
Figure 6:
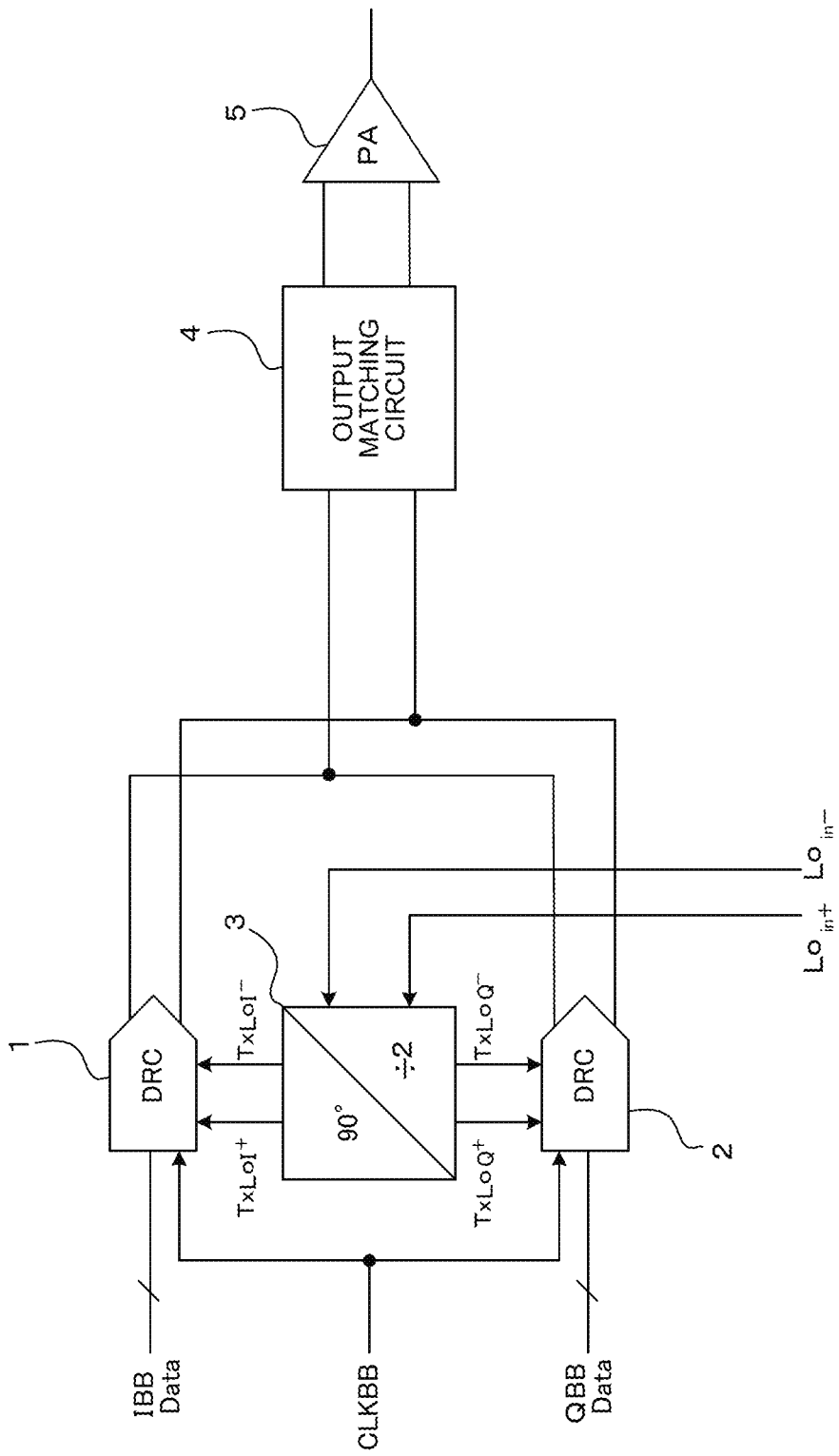
FIG. 6 illustrates a configuration of a conventional direct RF modulation transmitter.
Figure 7:
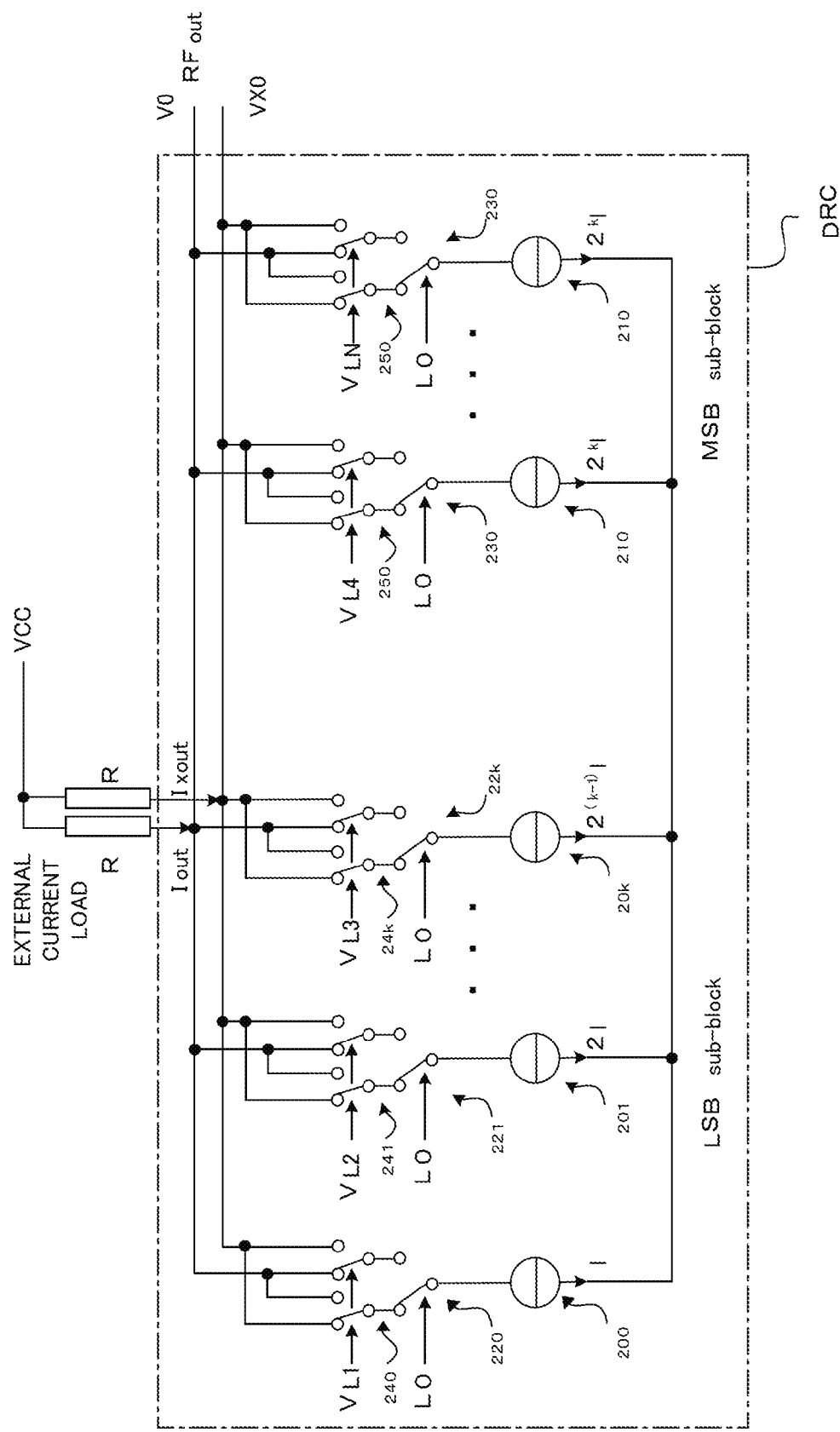
FIG. 7 is a diagram for describing a configuration of a conventional DRC.

FIG. 5 illustrates gain characteristics for quantization noise when fs is 1 Hz, local frequency is 100 Hz, N is 2, and a is 1 as an example. The longitudinal axis of FIG. 5 gives gain of the direct RF modulation transmitter, and the lateral axis gives frequencies of signals. A frequency where gain given in the longitudinal axis is a local minimum is typically called a Notch frequency. Low quantization noise can be implemented near the Notch frequency by thoroughly filtering the quantization noise calculated based on the bit number in the digital-to-analog conversion.

The Notch frequency may be arbitrarily set by combining number of stages N of the DDRCs and the sampling frequency fs. With this embodiment, adjustment of the Notch frequency to the low noise required frequency band allows control of the bit number in the digital-to-analog conversion required by the respective DRCs.

Moreover, with the direct RF modulation transmitter illustrated in FIG. 1, the delay control circuit 309 sets the same delay amount for the i-th (i is a number equal to or greater than 1 and equal to or less than N) DRC of the DRCs 302a to 302n and the i-th DRC of the DRCs 306a to 306m when the N-number of DRCs 302a to 302n and the M-number of DRCs 306a to 306m are the same (for the sake of simplicity of explanation, there are an N-number of the DRCs 302a to 302n and an N-number of the DRCs 306a to 306m.)

At this time, filtering characteristics of the filtering of the quantization noise generated during the digital-to-analog conversion of the I digital baseband signal and quantization noise generated during the digital-to-analog conversion of the Q digital baseband signal are the same. Furthermore, it can be understood from the properties of the FIR filter that the filtering effect is highest at a predetermined detuning frequency.

Circuit Area

Next, area of an entire current source of a direct RF modulator using conventional DRCs and area of an entire current source of a direct RF modulator constituted by the DRCs and the delay control circuit to which the present invention is applied are compared using specific numbers.

The area of the entire current source of a 10-bit DRC in the conventional direct RF modulation transmitter is referred to as SO. Assume that the bit number is increased by only one bit in order to reduce the quantization noise, the area of the entire current source will be four times SO. When the bit number is increased by two bits, the area of the entire current source will be 16 times SO. The noise effect as a result thereof is 6 dB and 12 dB, respectively, according to the aforementioned Equation 2.

Meanwhile, in the case of aligning in parallel two 10-bit DRCs by applying the present invention, that is, setting N and M to 2 so as to reduce the noise level over some frequencies, the area of the entire current source thereof only needs to be two times SO. Moreover, even if N and M are set to 4, it only becomes four times the original area SO.

According to such an embodiment, a low noise transmitter can be implemented with a smaller area than in the case of the above example of simply increasing the bit number of the conventional direct RF modulation transmitter. Moreover, in the case of the present embodiment, since noise is reduced at some frequency points by a noise filter, the entire noise floor cannot be reduced. However, as mentioned above, the communication system strictly requires low noise in a frequency band of a predetermined range. Therefore, if the sampling frequency is adjusted using Equation 4 in accordance with the frequency band that requires low noise, number N of the DRCs can be controlled to a relatively small number.

Furthermore, in many cases, as described above, noise in the vicinity of the target band (frequency band requiring low noise) can be greatly reduced lower than the aforementioned 6 dB and 12 dB due to the notch illustrated in FIG. 5. According to this embodiment, this allows implementation of a direct RF modulation transmitter with a smaller area and less noise than by the conventional method. Note that the present invention described above is not particularly limited to the exemplary embodiments described and illustrated in detail, and includes all embodiments bringing about the same results according to the object of the present invention. Moreover, the present invention is not limited to combination of aspects of the invention claimed in the appended claims, and may be attained by some of various desired combinations of all disclosed aspects.

INDUSTRIAL APPLICABILITY

The transmitter of the present invention can have a miniaturized circuit scale with little noise, and thus is a preferable configuration for small equipment.

REFERENCE SIGNS LIST

301a~301n, 308a~308m: DDRC
302a~302n, 306a~306m: DRC
303: Divide-by-2 divider
304a~304n, 307a~307m: delay circuit
305: output matching circuit
309: delay control circuit
501a~501k: flip-flop circuit
502: multiplexer

The invention claimed is:

1. A transmitter, comprising:
   a plurality of direct RF converters connected in parallel;
   a plurality of delay circuits for delaying a digital baseband input signal to be input to the plurality of direct RF converters;
   an adder for adding respective output signals output from the plurality of direct RF converters; and
   a delay control circuit for setting a delay amount for the digital baseband input signal for each of the plurality of delay circuits,
   wherein each of the direct RF converters receives the digital baseband input signal and an RF signal, modulates the RF signal with the digital baseband input signal, and outputs the resulting modulated signal as the output signal.

2. The transmitter according to claim 1, wherein the plurality of delay circuits are connected to the plurality of direct RF converters, by one-to-one.

3. The transmitter according to claim 1, wherein the plurality of direct RF converters includes a first block including an N-number of the direct RF converters and
   a second block including an M-number of the direct RF converters, wherein
   each of the direct RF converters included in the first block receives an in-phase digital baseband input signal and a first RF signal, modulates the first RF signal with the in-phase digital baseband input signal, and outputs the resulting modulated signal as a first output signal,
   each of the direct RF converters included in the second block receives an quadrature digital baseband input signal and a second RF signal having a 90-degree different phase than the first RF signal, modulates the second RF signal with the quadrature digital baseband input signal, and outputs the resulting modulated signal as a second output signal, and
   the adder adds the first output signals from the N-number (N is a natural number) of the respective direct RF converters included in the first block and the second output signals from the M-number (M is a natural number) of the respective direct RF converters included in the second block.

4. The transmitter according to claim 1, wherein the delay control circuit sets a delay amount for each of the delay circuits connected to the N-number of direct RF converters included in the first block to delay the in-phase digital baseband input signal, and sets a delay amount for each of the delay circuits connected to the M-number of direct RF converters included in the second block to delay the quadrature digital baseband input signal.

5. The transmitter according to claim 4, wherein each of the first block and the second block includes the N-number of direct RF converters (M=N), and
the delay control circuit sets the same delay amount to the i-th (i is a number equal to or greater than 1 and equal to or less than N) direct RF converter of the direct RF converters included in the first block, and the i-th direct RF converter of the direct RF converters included in the second block.

6. A transmitter comprising:
a plurality of direct RF converters connected in parallel;
a plurality of delay circuits for delaying a digital baseband input signal to be input to the plurality of direct RF converters; and
an adder for adding respective output signals output from the plurality of direct RF converters,
wherein each of the direct RF converters receives the digital baseband input signal and an RF signal, modulates the RF signal with the digital baseband input signal, and outputs the resulting modulated signal as the output signal, and
the delay circuits generate a delayed signal resulting from a delay control circuit for delaying a period of the digital baseband input signal data rate by an integral multiple in accordance with a delayed amount.

7. The transmitter according to claim 6, wherein the delay circuits include an equal number of flip-flop circuits to the integral multiple.

* * * * *